United States Patent [19]

Hovens

[11] Patent Number: 4,937,538
[45] Date of Patent: Jun. 26, 1990

[54] CIRCUIT ARRANGEMENT FOR SYNCHRONIZING AN OSCILLATOR

[75] Inventor: Paulus J. M. Hovens, Eindhoven, Netherlands

[73] Assignee: U.S. Philips Corporation, New York, N.Y.

[21] Appl. No.: 321,605

[22] Filed: Mar. 10, 1989

[30] Foreign Application Priority Data

Apr. 5, 1988 [NL] Netherlands .......................... 8800852

[51] Int. Cl.$^5$ ............................................... H03L 7/10
[52] U.S. Cl. .......................................... 331/17; 331/14; 331/25
[58] Field of Search ...................... 331/17, 14, 18, 25, 331/DIG. 2

[56] References Cited

U.S. PATENT DOCUMENTS

| | | | |
|---|---|---|---|
| 4,524,333 | 6/1985 | Iwata et al. | 331/17 |
| 4,535,358 | 8/1985 | Duijkers | 331/11 X |
| 4,829,268 | 5/1989 | Leuthold et al. | 331/17 |

OTHER PUBLICATIONS

Lewis, D. J. L.; "Switched Capacitor Fitters for PLL"; *Electronic Engineering*; vol. 55, No. 677, May 1983, pp. 27, 28.

*Primary Examiner*—David Mis
*Attorney, Agent, or Firm*—Edward W. Goodman

[57] ABSTRACT

A synchronizing circuit arrangement including an oscillator and a low-pass filter with a large time constant can be integrated in an integrated circuit, which filter has at least a switch arranged in series with a capacitor, because the switch is controlled by a periodical pulsatory control signal, which is derived from the oscillator signal, for a period of conductance which is many times shorter, at least a hundred times, than a period of the control signal. A hold circuit for holding and transferring the signal present across the filter during the period of conductance of the switch is connected to a proportional part of the filter, which hold circuit includes a second switch which is synchronous with the first switch.

7 Claims, 1 Drawing Sheet

CIRCUIT ARRANGEMENT FOR SYNCHRONIZING AN OSCILLATOR

BACKGROUND OF THE DISCLOSURE

1. Field of the Invention

The invention relates to a circuit arrangement for synchronizing an oscillator with an incoming synchronizing signal, comprising a phase discriminator having a first input terminal for receiving the synchronizing signal, a second input terminal for receiving a signal generated by the oscillator, and an output terminal for supplying a signal, which depends on the phase difference between the input signals of the phase discriminator, to a low-pass filter for smoothing the output signal of the phase discriminator and for applying a control signal to a control input terminal of the oscillator, the low-pass filter comprising at least a switch and a capacitor arranged in series therewith.

2. Description of Related Art

A circuit arrangement of this type is known from European Patent Application No. 72,751. The circuit arrangement described in this Application forms part of an integrated circuit which also incorporates the capacitor of the low-pass filter because the charge and discharge currents of the capacitor are very small, namely of the order of several tens nano-amperes, and because the switch conducts only during a part of the period for charging or discharging the capacitor. For this purpose the switch receives control pulses from the phase discriminator. However, the presence and the duration of these pulses depend on the phase difference established by the phase discriminator. Moreover, very small, stable currents can only be obtained when using certain integration techniques.

SUMMARY OF THE INVENTION

It is an object of the invention to provide a circuit arrangement of the type described above in which substantially all elements, even the capacitor, can be integrated and in which the control pulses are always present and have a duration which does not depend on the phase difference, and in which the charge and discharge currents need not be very small. To this end a circuit arrangement according to the invention is characterized in that the circuit arrangement also comprises a pulse generator coupled to the oscillator for generating a periodical pulsatory control signal, which is derived from the oscillator signal, for controlling the switch for a period of conductance which is many times shorter, at least a hundred times, than a period of the control signal. Due to this measure, the control pulses for the switch are always present and they are always coupled in frequency and phase to the oscillator, even when the oscillator does not have the correct frequency and/or phase.

Preferably, a circuit arrangement is characterized in that a hold circuit is connected to a proportional part of the low-pass filter for holding and transferring the signal present across the filter during the period of conductance of the switch. Otherwise a short-lasting variation, which occurs during the period of conductance of the switch, would be lost.

The hold circuit advantageously comprises a second switch which is also controlled by the pulse generator, the second switch being coupled to the junction point of the first switch and the capacitor and the two switches being simultaneously conducting or blocked, and a second capacitor which is coupled to the second switch, the voltage which is present at the second capacitor being the control signal for the oscillator. Since the capacitance of the second capacitor is not important, this capacitance can be chosen arbitrarily so that this capacitor can also be integrated.

The circuit arrangement may be characterized in that the capacitor is connected to a first input terminal of an amplifier at one end and to an output terminal of the amplifier at the other end, a second input terminal of the amplifier being connected to a reference voltage. Dependent on the gain of the amplifier, a multiplication effect is obtained thereby, so that an even lower resistance value can be chosen while maintaining the time constant while the multiplication factor is not too high, which further enhances the possibility of integration of the circuit arrangement.

BRIEF DESCRIPTION OF THE DRAWINGS

The invention be described in greater detail, by way of example, with reference to the accompanying drawing in which:

In FIG. 1, the reference numeral 1 denotes a signal source. A low-pass filter 3 is connected to an output terminal 2 of this source. Filter 3 comprises, for example, the series arrangement of a resistor R1, which comprises the internal impedance of source 1, and a capacitor C1. This series arrangement is connected between terminal 2 and ground, and the series arrangement of two resistors R2 and R3 and a capacitor C2 is aranged parallel to capacitor C1. The junction point of resistors R2 and R3 constitutes the output terminal of filter 3. In a circuit arrangement for the line synchronization in a picture display device, source 1 is a phase discriminator, filter 3 is a loop filter and the output terminal of the filter 3 is connected to the control input terminal 4 of a line oscillator 5. The components of filter 3 may have the following values:

| R1 = 500 Ω | C1 = 33 nF |
|---|---|
| R2 = 160 kΩ | C2 = 4.7 μF |
| R3 = 1.8 kΩ | |

Filter 3 is a low-pass filter for smoothing the signal at terminal 2 and for applying the obtained control signal to terminal 4 to influence the frequency and/or the phase of the signal generated by oscillator 5. The filter comprises a part, constituted by capacitor C2, for passing on a voltage which is proportional to the integral with time of the output current of discriminator 1, i.e. the so-called integral part of the filter for controlling the oscillator over a long period, and a part, constituted by resistors R2 and R3, for passing on a voltage which is proportional to the output voltage of discriminator 1, i.e. the so-called proportional part of the filter for transferring rapid variations of the signal source. The signal generated by oscillator 5 is applied to discriminator 1 in which its phase is compared with that of an incoming synchronizing signal, resulting in the signal at terminal 2. In the synchronized state of the phase control loop constituted by elements of FIG. 1, the oscillator signal has the same frequency and substantially the same phase as the synchronizing signal.

Figure 1:
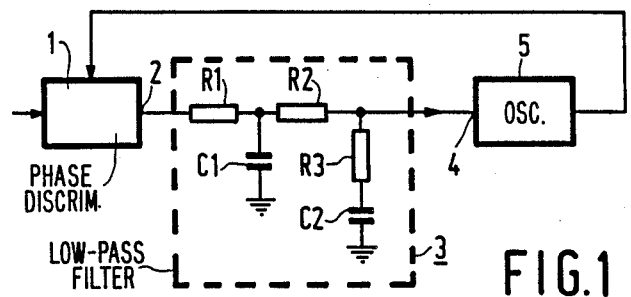
FIG. 1 shows a circuit diagram of a known circuit arrangement including a low-pass filter to which the invention may be applicable.

Most parts of the synchronizing circuit, of which FIG. 1 shows some elements, are incorporated in an integrated circuit. However, capacitors having large capacitances cannot be integrated. Thus it is desirable to choose a smaller capacitance, notably for capacitor C2. A real value for this is 100 pF because a higher value would require a too large surface area of the semiconductor material. This value can be increased by having the capacitor form part of a Miller integrator so that a multiplication effect, for example by a factor of 10, is obtained. A larger multiplication factor could lead to instability. At least in the linear range of the amplifier forming part of the integrator, the capacitor behaves as a capacitor of 1000 pF, i.e. a capacitance which is $4.7 \times 10^3$ times as small as that of capacitor C2. To maintain the same time constant, resistors R2 and R3 must have values which should be correspondingly higher, i.e. 752 MΩ and 8.5 MΩ, respectively. Resistors having such high values cannot be integrated. By incorporating a switch in series with filter 3, which switch is conducting during a part of the period of a periodical switching signal applied thereto, while resistors R2 and R3 are replaced by resistors whose values are lower than the values of resistors R2 and R3, an RC network is obtained which has the same time constant as the original network. A condition therefor is that the new resistance values are in the same ratio to the original values as is the ratio between the period of conductance of the switch and the period of the switching signal. If the switch conducts, for example for 250 ns over a period of 5 line periods, i.e. 320 μs according to the European television standard, the new resistance values are obtained by multiplication by a factor of 0.25/320. Consequently, the new values are: R′=587 kΩ and R′3=6.6 kΩ, which is integrable.

The filter obtained in the manner described has the same voltage response as the filter constituted by elements R2, R3 and C2 in FIG. 1. If a voltage variation occurs at terminal 2, an exponentially varying voltage is present at the junction point of resistors R′2 and R′3, i.e. the voltage across capacitor C′2 augmented by a short-lasting perturbation which is proportional to the perturbation at terminal 2 and which is passed on through resistor R′2. After blocking of the switch, this perturbation has substantially disappeared. However a hold circuit provides the possibility of passing on the perturbation to terminal 4 for controlling oscillator 5.

Figure 2:
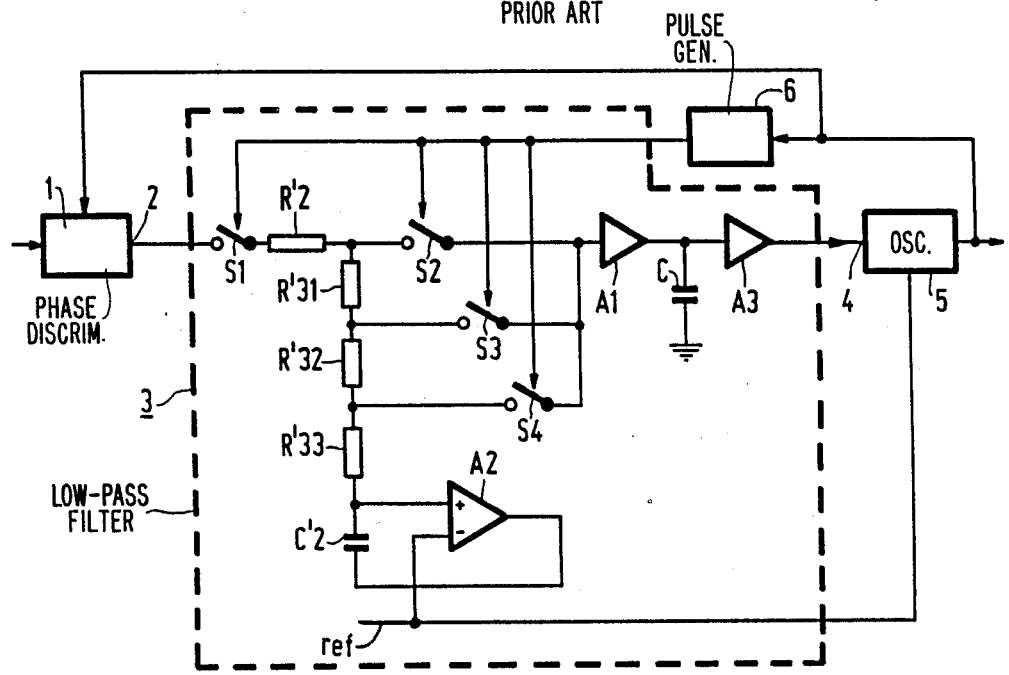
FIG. 2 shows a circuit diagram of an embodiment of the circuit arrangement according to the invention.

A circuit arrangement formed in accordance with the above-mentioned principles is shown in FIG. 2. In this Figure the same components as those in FIG. 1 have the same reference symbols. The series arrangement of a switch S1, four resistors R′2, R′31, R′32 and R′33 and a capacitor C′2 is connected to the terminal 2. The junction point of resistors R′2 and R′31 is connected to the input of an amplifier A1 via a switch S2. The junction point of resistors R′31 and R′32 is connected to the amplifier A1 input via a switch S3 and the junction point of resistors R′32 and R′33 is connected to the amplifier A1 input via a switch S4. A capacitor C is connected between the output of amplifier A1 and ground. The junction point of resistor R′33 and capacitor C′2 is connected to the non-inverting input of an operational amplifier A2 whose inverting input is connected to a reference voltage. The output of amplifier A2 is connected to the other terminal of capacitor C′2 and the output of amplifier A1 is connected to terminal 4 via a buffer amplifier A3.

The signal at the output of oscillator 5 is applied to discriminator 1 and to stages (not shown) for the horizontal deflection in a picture display tube. A pulse generator 6 is coupled to the output of oscillator 5. Generator 6 generates control pulses which are derived from the signal of oscillator 5 and whose frequency is obtained by division of the frequency of the oscillator. These pulses control switches S1, S2, S3 and S4. The resistors in FIG. 2 have, for example the following values:

| R′2 = 560 kΩ | R′32 = 6 kΩ |
|---|---|
| R′31 = 30 kΩ | R′33 = 0.6 kΩ |

Capacitors C′2 and C have a capacitance of 100 and 3 pF, respectively. The gain factors of amplifiers A1 and A2 are 1 and 10, respectively. The four switches are formed by means of, for example FET transistors.

In a first operation mode, switches S1 and S2 are simultaneously conducting during 250 ns over an interval of one line period, i.e. 64 μs, and they are simultaneously blocking during the rest of the period. The ratio between the period of conductance of switches S1 and S2 and the period is 1:256. The other switches remain blocked. Under these circumstances the time constant of the filter is 256 times the value of the product of the effective capacitance, i.e. 1000 pF, and the sum of the resistances and is thus equal to approximately 0.15 s. Switch S2, amplifier A1 and capacitor C constitute the hold circuit for passing on rapid variations of the signal to terminal 2 via the proportional part of the filter. The proportionality factor of the proportional part is equal to the ratio between R′31+R′32+R′31+R′32+R′33 and is thus equal to approximately 0.062. With this operation mode, the phase control loop constituted by the elements of FIG. 2 is suitable for receiving and handling line-synchronizing signals from video recorders.

In a second operation mode, switches S1 and S3 are simultaneously conducting during 250 ns over an interval of 5 line periods, i.e. 320 μs and they are simultaneously blocked during the rest of the period. The other switches remain blocked. Now the time constant of the filter is 5 times as large as in the first-mentioned case, i.e. approximately 0.76 s and the proportionality factor of the proportional part of the filter is approximately 0.011. Switch S3, amplifier A1 and capacitor C now constitute the hold circuit. With this operation mode, the control loop is suitable for handling line-synchronizing signals from, for example television transmitters in the case when the loop is not yet locked and must therefore be capable of reacting rapidly.

In a third operation mode, switches S1 and S4 are simultaneously conducting during 250 ns over an interval of 50 line periods and they are simultaneously blocked during the rest of the period. The other switches remain blocked. The time constant of the filter is now approximately 7.55 s and the proportionality factor of the proportional part is fairly small, namely approximately 0.001. The control loop then has an extremely narrow band and thus reacts very slowly to variations of the phase between the oscillator and synchronizing signals. This is the operation mode for the synchronized state of the control loop when receiving signals from television transmitters.

It will be evident that other operation modes are possible. The resistors and the gain of amplifiers A1 and A3 are given therefor the suitable values and the suitable control pulses for the various switches are generated by generator 6. All kinds of combinations of resistors and switches are possible in this case. For switching between the various operation modes, the circuit arrangement of FIG. 2 comprises known switching means which are not shown in the Figure for the sake of simplicity, particularly a coincidence detector for establishing the locked state of the control loop and a facility for switching parts of the picture display device when receiving video recorder signals.

In the embodiment shown several numbers have been mentioned for the ratio between the period of conductance of switch S1 and the period of the control pulses applied thereto. It will be evident that the function need not be limited thereto. In practice it has been found that a ratio of more than one hundred yielded good results.

Figure 3:
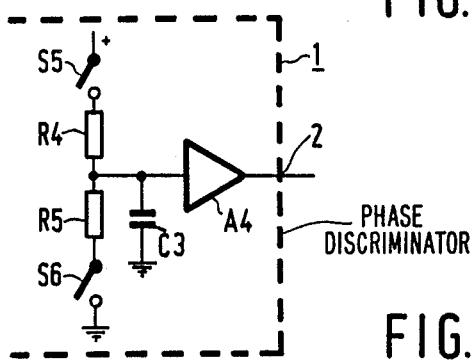
FIG. 3 shows a detail of this embodiment.

It may be noted that the elements R1 and C1 in FIG. 1 are not incorporated in the filter 3 of FIG. 2. The reason is that the output circuit of discriminator 1 can be formed in the manner shown in FIG. 3. In this case the series arrangement of a switch S5, two resistors R4 and R5 and a switch S6 is connected between a positive power supply voltage and ground. Dependent on the phase between the signals applied to the discriminator, either switch S5 or switch S6 or neither of the two conducts so that the voltage at the junction point of the resistors would be positive, zero oz floating without any further measures. This voltage is integrated by means of a capacitor C3, resulting in a control voltage having a triangular shape, followed by a constant value. The junction point of elements R4, R5 and C3 is connected to an input of a buffer amplifier A4, the output of which constitutes the output terminal 2 of discriminator 1. The two resistors have a value of, for example 300 kQ and capacitor C3 has a capacitance of 45 pF. The elements of FIG. 3 can thus be integrated and form part of the same integrated circuit in which the other parts of the line-synchronizing circuit are also incorporated. It will be noted that the switches in FIG. 3 have a longer period of conductance than those shown in FIG. 2 as compared with the period of the pulses applied thereto, i.e. the line period in the case of FIG. 3. Otherwise the phase discriminator would obtain too little for incorrect information for generating the control) signal.

It will be evident that the capacitance of capacitor C in FIG. 2 is of no significance and can thus be chosen arbitrarily, so that capacitor C can be incorporated in the same integrated circuit. An input current from the phase discriminator 1 with the information of this discriminator flows through the resistors of filter 3, which as stated, have high values. It will therefore be evident that the resistors can be replaced by current sources comprising the information of the phase discriminator. Oscillator 5 receives a reference voltage which determines the nominal frequency of the oscillator, i.e. the frequency in the synchronous state of the phase control loop. At this frequency the oscillator operates in the center of its frequency-voltage characteristic. It is favorable to choose a reference voltage for amplifier A2 which is the same as the reference voltage for oscillator 5 so that the linear range of amplifier A2 substantially coincides with the control range of the oscillator. A variation of the time constant in the locked state of the control loop then does not occur.

Finally, it will also be evident that the invention need not be limited to the described embodiment of a line-synchronizing circuit in a picture display device, but may be applicable to any synchronizing circuit arrangement for an oscillator and including a low-pass filter with a large time constant.

I claim:

1. A circuit arrangement :or synchronizing an oscillator with an incoming synchronizing signal, comprising a phase discriminator having a first input terminal for receiving the synchronizing signal, a second input terminal for receiving a signal generated by the oscillator, and an output terminal for supplying a signal, which depends on the phase difference between the input signals of the phase discriminator, to a low-pass filter for smoothing the output signal of the phase discriminator and for applying a control signal to a control input terminal of the oscillator, the low-pass filter comprising at least a switch and a capacitor arranged in series therewith, characterized in that the circuit arrangement also comprises a pulse generator coupled to the oscillator for generating a periodical pulsatory control signal, which is derived from the oscillator signal for controlling the switch for a period of conductance which is many times shorter, at least a hundred times, than a period of the control signal.

2. A circuit arrangement as claimed in claim 1, characterized in that a hold circuit is connected to a proportional part of the low-pass filter for holding and transferring the signal present across the filter during the period of conductance of the switch.

3. A circuit arrangement as claimed in claim 2, characterized in that the hold circuit comprises a second switch which is also controlled by the pulse generator, the second switch being coupled to the junction point of the first switch and the capacitor and the two switches being simultaneously conducting or blocked, and a second capacitor which is coupled to the second switch, the voltage which is present at the second capacitor being the control signal for the oscillator.

4. A circuit arrangement as claimed in claim 1 characterized in that the control signal generated by the pulse generator is derived from the oscillator signal by means of frequency division.

5. A circuit arrangement as claimed in claim 1, characterized in that the capacitor is connected to a first input terminal of an amplifier at one end and to the output terminal of an amplifier at the other end, a second input terminal of the amplifier being connected to a reference voltage.

6. A circuit arrangement as claimed in claim 5, characterized by a reference voltage applied to the oscillator for determining a nominal frequency of the signal generated by the oscillator, said reference voltage being the same as the reference voltage for the amplifier.

7. A circuit arrangement as claimed in claim 1, characterized by switching means for switching the phase discriminator or the switching mode of the switch, respectively.

* * * * *